United States Patent
Daimon

(10) Patent No.: US 11,038,484 B2
(45) Date of Patent: Jun. 15, 2021

(54) ACOUSTIC WAVE DEVICE, BAND PASS FILTER, AND MULTIPLEXER

(71) Applicant: Murata Manufacturing Co., Ltd., Nagaokakyo (JP)

(72) Inventor: Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 71 days.

(21) Appl. No.: 16/589,198

(22) Filed: Oct. 1, 2019

(65) Prior Publication Data
US 2020/0036362 A1 Jan. 30, 2020

Related U.S. Application Data

(63) Continuation of application No. PCT/JP2018/015234, filed on Apr. 11, 2018.

(30) Foreign Application Priority Data

Apr. 20, 2017 (JP) .............................. JP2017-083373

(51) Int. Cl.
*H03H 9/145* (2006.01)
*H03H 9/02* (2006.01)
(Continued)

(52) U.S. Cl.
CPC ........ *H03H 9/145* (2013.01); *H03H 9/02007* (2013.01); *H03H 9/205* (2013.01); *H03H 9/54* (2013.01); *H03H 9/706* (2013.01)

(58) Field of Classification Search
CPC .... H03H 9/145; H03H 9/02007; H03H 9/205; H03H 9/54; H03H 9/706
See application file for complete search history.

(56) References Cited

U.S. PATENT DOCUMENTS 5,895,996 A 4/1999 Takagi et al.
2002/0044497 A1 4/2002 Kachi et al.
(Continued)

FOREIGN PATENT DOCUMENTS

JP 2000-286663 A 10/2000
JP 2002-084162 A 3/2002
(Continued)

OTHER PUBLICATIONS

Official Communication issued in International Patent Application No. PCT/JP2018/015234, dated May 29, 2018.

*Primary Examiner* — Samuel S Outten
(74) *Attorney, Agent, or Firm* — Keating & Bennett, LLP

(57) ABSTRACT

An acoustic wave device includes a piezoelectric substrate and an IDT electrode on the piezoelectric substrate. The IDT electrode includes a first busbar and a second busbar that oppose each other, multiple first electrode fingers, multiple second electrode fingers, multiple first offset electrodes, and multiple second offset electrodes. A virtual line connecting the leading ends of the first electrode fingers is referred to as a first envelope. The first envelope is included relative to the acoustic-wave propagation direction. A virtual line connecting the leading ends of the second electrode fingers is referred to as a second envelope. The second envelope is inclined relative to the acoustic-wave propagation direction. The direction in which the first offset electrodes extend and the direction in which the second offset electrodes extend inclined relative to the direction orthogonal or substantially orthogonal to the acoustic-wave propagation direction.

15 Claims, 6 Drawing Sheets

(51) Int. Cl.
*H03H 9/205* (2006.01)
*H03H 9/54* (2006.01)
*H03H 9/70* (2006.01)

(56) References Cited

U.S. PATENT DOCUMENTS

2003/0193668 A1 10/2003 Wakana et al.
2015/0340587 A1 11/2015 Tsutsumi
2016/0182010 A1* 6/2016 Nakamura ......... H03H 9/14594
333/193

FOREIGN PATENT DOCUMENTS

| JP | 2004-003953 A | 1/2004 |
| JP | 2015-222886 A | 12/2015 |
| JP | 2016-213903 A | 12/2016 |
| WO | 96/10293 A1 | 4/1996 |

* cited by examiner

ACOUSTIC WAVE DEVICE, BAND PASS FILTER, AND MULTIPLEXER

CROSS REFERENCE TO RELATED APPLICATIONS

This application claims the benefit of priority to Japanese Patent Application No. 2017-083373 filed on Apr. 20, 2017 and is a Continuation Application of PCT Application No. PCT/JP2018/015234 filed on Apr. 11, 2018. The entire contents of each application are hereby incorporated herein by reference.

BACKGROUND OF THE INVENTION

1. Field of the Invention

The present invention relates to an acoustic wave device, a band pass filter, and a multiplexer.

2 Description of the Related Art

Heretofore, acoustic wave devices have been widely used, for example, in filters in cellular phones. Japanese Unexamined Patent Application Publication No. 2000-286663 describes an acoustic wave resonator including an inclined IDT electrode in which the busbars incline relative to the acoustic-wave propagation direction. The busbars which are inclined as described above cause suppression of spurious responses produced due to the transverse mode.

However, in an acoustic wave resonator including an inclined IDT electrode of the related art, the response caused by the upper end of the stop band (an area in which the wave length of acoustic waves is constant because the acoustic waves are confined in a metal grating having a periodic structure), that is, the stop-band response tends to be large. Accordingly, when a band pass filter including the acoustic wave resonator and a different band pass filter are connected to a common point, ripples due to the stop-band response may occur in the pass band of the different band pass filter. This may cause the insertion loss of the different band pass filter to be degraded.

SUMMARY OF THE INVENTION

Preferred embodiments of the present invention provide acoustic wave devices and band pass filters which each enable the stop-band response to be reduced or prevented.

Preferred embodiments of the present invention also provide multiplexers which each enable the stop-band response to be reduced or prevented and in which degradation of insertion loss due to the stop-band response hardly occurs.

An acoustic wave device according to a preferred embodiment of the present invention includes an acoustic wave device including a piezoelectric substrate, and an interdigital transducer (IDT) electrode disposed on the piezoelectric substrate. The IDT electrode includes a first busbar and a second busbar, a plurality of first electrode fingers, a plurality of second electrode fingers, a plurality of first offset electrodes, and a plurality of second offset electrodes. The first busbar and the second busbar oppose each other. The plurality of first electrode fingers include first ends connected to the first busbar. The plurality of second electrode fingers include first ends connected to the second busbar. The plurality of second electrode fingers and the plurality of first electrode fingers are interdigitated. The plurality of first offset electrodes include first ends connected to the first busbar and face the plurality of second electrode fingers with gaps interposed in between. The plurality of second offset electrodes include first ends connected to the second busbar and face the plurality of first electrode fingers with gaps interposed in between. The IDT electrode includes an overlap area which is an area in which the first electrode fingers and the second electrode fingers overlap each other when viewed in an acoustic-wave propagation direction. The first electrode fingers and the second electrode fingers are adjacent to each other. When a virtual line connecting leading ends of the plurality of first electrode fingers to each other is referred to as a first envelope, the first envelope is inclined relative to the acoustic-wave propagation direction. When a virtual line connecting leading ends of the plurality of second electrode fingers to each other is referred to as a second envelope, the second envelope is inclined relative to the acoustic-wave propagation direction. A direction in which the first offset electrodes extend and a direction in which the second offset electrodes extend are inclined relative to a direction orthogonal or substantially orthogonal to the acoustic-wave propagation direction.

In an acoustic wave device according to a preferred embodiment of the present invention, in a first area which is an area in which the first electrode fingers include the first offset electrodes when viewed in a direction parallel or substantially parallel to a direction in which the second envelope extends, the first electrode fingers include portions extending parallel or substantially parallel to the direction in which the first offset electrodes extend. In a second area which is an area in which the second electrode fingers include the second offset electrodes when viewed in a direction parallel or substantially parallel to a direction in which the first envelope extends, the second electrode fingers include portions extending parallel or substantially parallel to the direction in which the second offset electrodes extend.

In an acoustic wave device according to a preferred embodiment of the present invention, the first busbar includes a portion extending parallel or substantially parallel to the second envelope, and the second busbar includes a portion extending parallel or substantially parallel to the first envelope.

In an acoustic wave device according to a preferred embodiment of the present invention, the first busbar extends parallel or substantially parallel to the second envelope, and the second busbar extends parallel or substantially parallel to the first envelope.

In an acoustic wave device according to a preferred embodiment of the present invention, the first busbar and the second busbar are inclined relative to the acoustic-wave propagation direction, and the first busbar and the second busbar extend parallel or substantially parallel to each other.

In an acoustic wave device according to a preferred embodiment of the present invention, the first envelope and the second envelope define or substantially define a rhombus in plan view.

In an acoustic wave device according to a preferred embodiment of the present invention, the sizes, in a transverse direction, of the first electrode fingers, the second electrode fingers, the first offset electrodes, and the second offset electrodes are referred to as widths. The widths of the first electrode fingers and the first offset electrodes in a first area are narrower than the widths of the first electrode fingers in the overlap area. The first area is an area in which the first electrode fingers include the first offset electrodes when viewed in a direction parallel or substantially parallel to a direction in which the second envelope extends. The widths of the second electrode fingers and the second offset electrodes in a second area are narrower than the widths of the second electrode fingers in the overlap area. The second area is an area in which the second electrode fingers include the second offset electrodes when viewed in a direction parallel or substantially parallel to a direction in which the first envelope extends. In this case, degradation of return loss between the resonant frequency and the anti-resonant frequency may be reduced or prevented.

In an acoustic wave device according to a preferred embodiment of the present invention, the absolute value of an inclination angle of the first offset electrodes and the second offset electrodes is equal to or more than about 5°. The inclination angle is determined relative to the direction orthogonal or substantially orthogonal to the acoustic-wave propagation direction. In this case, the stop-band response may be further reduced or prevented.

A band pass filter according to a preferred embodiment of the present invention preferably includes a plurality of acoustic wave resonators. At least one of the acoustic wave resonators is an acoustic wave device configured in accordance with a preferred embodiment of the present invention.

A multiplexer according to a preferred embodiment of the present invention includes an antenna terminal connected to an antenna, and a plurality of band pass filters that are connected to the antenna terminal in common and that have pass bands different from each other. At least one of the band pass filters is a band pass filter according to a preferred embodiment of the present invention.

Acoustic wave devices and band pass filters according to preferred embodiments of the present invention may reduce or prevent the stop-band response.

Multiplexers according to preferred embodiments of the present invention enable the stop-band response to be reduced or prevented, and degradation of insertion loss due to the stop-band response hardly occurs.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the drawings.

It is to be noted that the preferred embodiments described herein are exemplary, and that the configurations of different preferred embodiments may be partially replaced or combined with each other.

Figure 1:
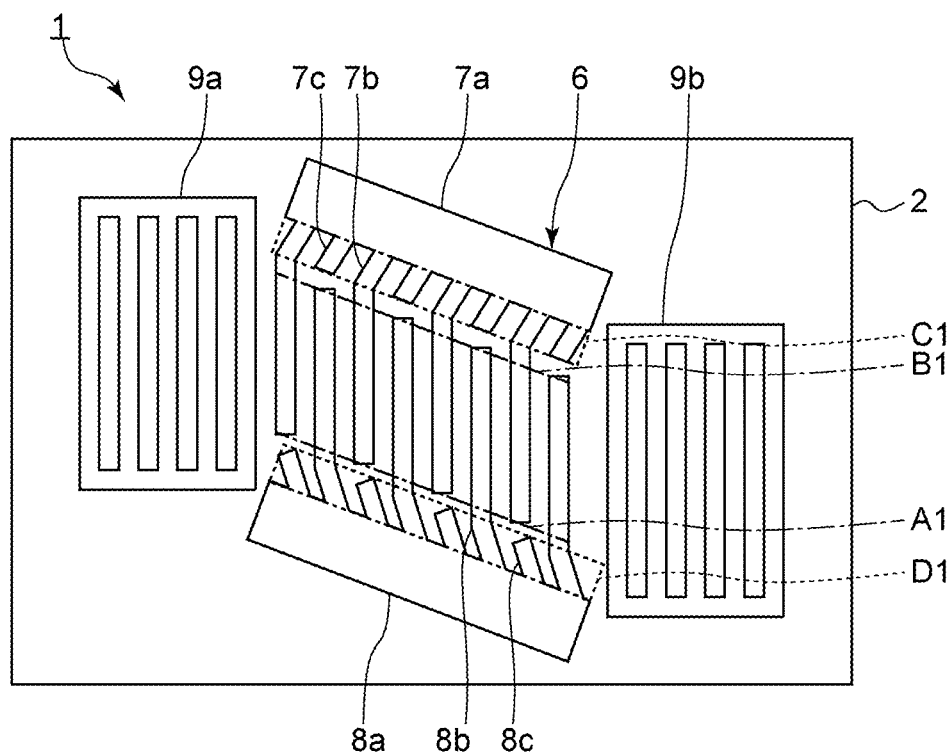
FIG. 1 is a schematic plan view of an acoustic wave device according to a first preferred embodiment of the present invention.
Figure 2:
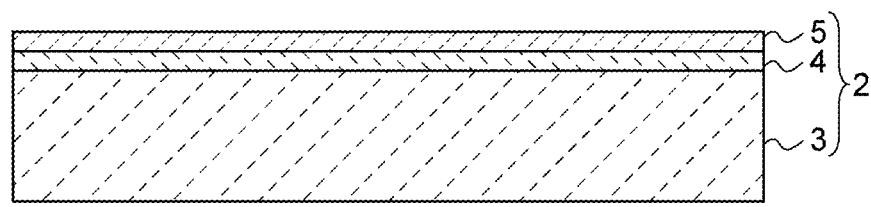
FIG. 2 is a schematic sectional view of a piezoelectric substrate according to the first preferred embodiment of the present invention.

FIG. 1 is a schematic plan view of an acoustic wave device according to a first preferred embodiment of the present invention. FIG. 2 is a schematic sectional view of a piezoelectric substrate according to the first preferred embodiment.

As illustrated in FIG. 1, an acoustic wave device 1 includes a piezoelectric substrate 2. As illustrated in FIG. 2, in the present preferred embodiment, the piezoelectric substrate preferably includes a support substrate 3, a low-acoustic-velocity film 4 disposed on the support substrate 3, and a piezoelectric film 5 disposed on the low-acoustic-velocity film 4. The low-acoustic-velocity film 4 is a film in which bulk waves propagate at a lower acoustic velocity than that of acoustic waves propagating in the piezoelectric film 5.

The piezoelectric film 5 is preferably made of 50° or about 50° Y-cut LiTaO$_3$. The cut-angle and the material of the piezoelectric film 5 is not limited to those described above, and may be any desirable angle and material. The piezoelectric film 5 may be made of piezoelectric single crystal other than LiTaO$_3$, such as, for example, LiNbO$_3$. Alternatively, the piezoelectric film 5 may be made of appropriate piezoelectric ceramic.

When the wave length defined by the electrode-finger pitch of an IDT electrode described below is denoted as λ, the film thickness of the piezoelectric film 5 is preferably about 0.3λ, for example. The film thickness of the piezoelectric film 5 is not limited to this.

The low-acoustic-velocity film 4 is preferably made of, for example, SiO$_2$. The low-acoustic-velocity film 4 may be made, for example, of a material including, as a main component, glass, silicon oxynitride, tantalum oxide, or a compound obtained by adding fluorine, carbon, or boron to silicon oxide such as SiO$_2$. The material of the low-acoustic-velocity film 4 may be any suitable material as long as it is a material with a relatively low acoustic velocity.

The support substrate 3 is preferably made of, for example, silicon. In the present preferred embodiment, the support substrate 3 is a high-acoustic-velocity member. The high-acoustic-velocity member is a member in which bulk waves propagate at a higher acoustic velocity than that of acoustic waves propagating in the piezoelectric film 5. The high-acoustic-velocity member is preferably made, for example, of a material including, as a main component, aluminum nitride, aluminum oxide, silicon carbide, silicon oxynitride, silicon, DLC film, or diamond. The material of the high-acoustic-velocity member may be any material as long as it is a material with a relatively high acoustic velocity.

A high-acoustic-velocity film, which is a high-acoustic-velocity member, may be disposed between the support substrate 3 and the low-acoustic-velocity film 4.

As illustrated in FIG. 1, an IDT electrode 6 is disposed on the piezoelectric substrate 2. The IDT electrode 6 includes a first busbar 7a and a second busbar 8a facing each other. The IDT electrode 6 includes multiple first electrode fingers 7b, in each of which one end is connected to the first busbar 7a. The IDT electrode 6 includes multiple second electrode fingers 8b, in each of which one end is connected to the second busbar 8a. The first electrode fingers 7b and the second electrode fingers 8b are interdigitated.

The IDT electrode 6 includes multiple first offset electrodes 7c, in each of which one end is connected to the first busbar 7a and which face the second electrode fingers 8b with gaps interposed in between. The IDT electrode 6 includes multiple second offset electrodes 8c, in each of which one end is connected to the second busbar 8a and which face the first electrode fingers 7b with gaps interposed in between.

When an alternating voltage is applied to the IDT electrode 6, acoustic waves are excited. A reflector 9a and a reflector 9b are disposed on both sides of the IDT electrode 6 in the acoustic-wave propagation direction. Thus, the acoustic wave device 1 according to the present preferred embodiment is an acoustic wave resonator.

The IDT electrode 6 is preferably made of a multilayer metal film which is a laminated layer of multiple metal layers. More specifically, the IDT electrode 6 preferably includes multiple layers laminated in the following sequence when viewed from the piezoelectric substrate 2 side: a Ti layer and an Al layer. The reflector 9a and the reflector 9b preferably have structures the same or substantially the same as that of the IDT electrode 6. The materials of the IDT electrode 6, the reflector 9a, and the reflector 9b are not limited to those described above. The IDT electrode 6, the reflector 9a, and the reflector 9b may include a single-layer metal film.

As illustrated in FIG. 1, the IDT electrode 6 according to the present preferred embodiment is an inclined IDT electrode. More specifically, the first busbar 7a and the second busbar 8a are inclined relative to the acoustic-wave propagation direction. This enables reduction or prevention of spurious responses. The first busbar 7a and the second busbar 8a extend parallel or substantially parallel to each other. However, the first busbar 7a and the second busbar 8a do not necessarily extend parallel or substantially parallel to each other.

A virtual line obtained by connecting the leading ends of the first electrode fingers 7b is referred to as a first envelope A1, and a virtual line obtained by connecting the leading ends of the second electrode fingers 8b is referred to as a second envelope B1. The length, in the direction in which a first offset electrode 7c extends, of the gap between the first offset electrode 7c and the corresponding second electrode finger 8b is defined as the gap length of the gap. In this case, the gap lengths of all of the gaps are the same or substantially the same. The lengths of all of the first offset electrodes 7c are also the same or substantially the same. Accordingly, the second envelope B1, which is a virtual line obtained by connecting the leading ends of the second electrode fingers 8b, is parallel or substantially parallel to the direction in which the first busbar 7a extends. Thus, the second envelope B1 inclines relative to the acoustic-wave propagation direction. The second envelope B1 does not necessarily extend parallel or substantially parallel to the first busbar 7a. The second envelope B1 may have any configuration as long as the second envelope B1 inclines relative to the acoustic-wave propagation direction. The lengths of the first offset electrodes 7c are not necessarily constant, and the gap lengths are not necessarily constant.

Similarly, the first envelope A1 is parallel or substantially parallel to the direction in which the second busbar 8a extends. The first envelope A1 inclines relative to the acoustic-wave propagation direction. The first envelope A1 does not necessarily extend parallel or substantially parallel to the second busbar 8a. The first envelope A1 may have any configuration as long as the first envelope A1 inclines relative to the acoustic-wave propagation direction.

In preferred embodiments of the present invention, the direction in which the first offset electrodes 7c extend crosses the direction in which the second offset electrodes 8c extend. More specifically, the first offset electrodes 7c and the second offset electrodes 8c extend in directions to provide axial symmetry with the acoustic-wave propagation direction regarded as the axis of symmetry.

The IDT electrode 6 includes an overlap area which is an area in which the first electrode fingers 7b and their adjacent second electrode fingers 8b overlap each other when viewed in the acoustic-wave propagation direction. An area, in which the first electrode fingers 7b include the first offset electrodes 7c when viewed in the direction parallel or substantially parallel to the direction in which the second envelope B1 extends, is referred to as a first area C1. In the first area C1, the first electrode fingers 7b extend in the direction parallel or substantially parallel to the direction in which the first offset electrodes 7c extend. In a portion other than the first area C1, the first electrode fingers 7b extend in the direction orthogonal or substantially orthogonal to the acoustic-wave propagation direction. Thus, the first electrode fingers 7b have a bent shape.

An area, in which the second electrode fingers 8b include the second offset electrodes 8c when viewed in the direction parallel or substantially parallel to the direction in which the first envelope A1 extends, is referred to as a second area D1. In the second area D1, the second electrode fingers 8b extend parallel or substantially parallel to the direction in which the second offset electrodes 8c extend. In a portion other than the second area D1, the second electrode fingers 8b extend in the direction orthogonal or substantially orthogonal to the acoustic-wave propagation direction. Thus, the second electrode fingers 8b have a bent shape.

In the present preferred embodiment, the first envelope A1 and the second envelope B1 incline relative to the acoustic-wave propagation direction, and that the first offset electrodes 7c and the second offset electrodes 8c incline relative to the direction orthogonal or substantially orthogonal to the acoustic-wave propagation direction. This enables reduction or prevention of the stop-band response even when the inclined IDT electrode 6 is included. This will be described below by comparing the first preferred embodiment with a comparative example. The comparative example is different from the first preferred embodiment in that the first offset electrodes and the second offset electrodes do not incline relative to the direction orthogonal or substantially orthogonal to the acoustic-wave propagation direction.

The return loss of the acoustic wave device according to the first preferred embodiment was compared with that according to the comparative example. The conditions of the acoustic wave device according to the first preferred embodiment were set as described below. The size, in the direction orthogonal or substantially orthogonal to the acoustic-wave propagation direction, of the overlap area of the IDT electrode is referred to as an overlap width. The inclination angle relative to the acoustic-wave propagation direction is referred to as a first inclination angle. The inclination angle relative to the direction orthogonal or substantially orthogonal to the acoustic-wave propagation direction is referred to as a second inclination angle.

Figure 3:
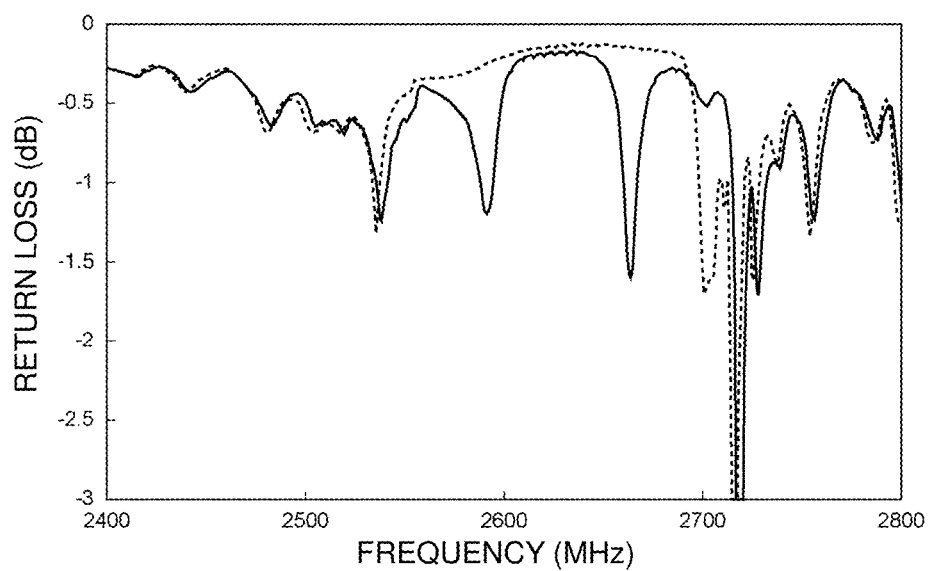
FIG. 3 is a diagram illustrating return loss of acoustic wave devices according to the first preferred embodiment of the present invention and a comparative example.

In the first preferred embodiment, the first inclination angle of the first busbar is the same or substantially the same as that of the second busbar. The same is true for the comparative example. In the first preferred embodiment, the absolute value of the second inclination angle of the first offset electrodes is the same or substantially orthogonal as that of the second offset electrodes. The conditions of the acoustic wave device according to the first preferred embodiment were set as follows:

The piezoelectric film: a material of 50° Y-cut LiTaO$_3$
The number of pairs of a first electrode finger and a second electrode finger of the IDT electrode: 67 pairs
The overlap width of the IDT electrode: about 20λ
The wave length of the IDT electrode: about 1.5 μm
The first inclination angle of the first busbar and the second busbar: about 7.5°
The absolute value of the second inclination angle of the first offset electrodes and the second offset electrodes: about 10°
The number of electrode fingers of a reflector: 41
The wave length of a reflector: about 1.5 μm
The conditions of the acoustic wave device according to the comparative example were set as follows:
The piezoelectric film: a material of 50° Y-cut LiTaO$_3$
The number of pairs of a first electrode finger and a second electrode finger of the IDT electrode: 67 pairs
The overlap width of the IDT electrode: about 20λ
The wave length of the IDT electrode: about 1.5 μm
The first inclination angle of the first busbar and the second busbar: about 7.5°
The absolute value of the second inclination angle of the first offset electrodes and the second offset electrodes: about 0°
The number of electrode fingers of a reflector: 41
The wave length of a reflector: about 1.5 μm FIG. 3 is a diagram illustrating return loss of the acoustic wave devices according to the first preferred embodiment and the comparative example. In FIG. 3, the solid line indicates the result of the first preferred embodiment, and the broken line indicates the result of the comparative example.

As illustrated in FIG. 3, it was discovered that, in the comparative example, the stop-band response occurs in a range between about 2750 MHz and about 2800 MHz. In contrast, it was discovered that, in the first preferred embodiment, reduction or prevention of the stop-band response is achieved.

Further, the first preferred embodiment was compared with the comparative example.

Multiple acoustic wave devices having the structure according to the first preferred embodiment were fabricated with different first inclination angles of the first busbar and the second busbar and different second inclination angles of the first offset electrodes and the second offset electrodes. Multiple acoustic wave devices according to the comparative example were fabricated with different first inclination angles of the first busbar and the second busbar.

Figure 4:
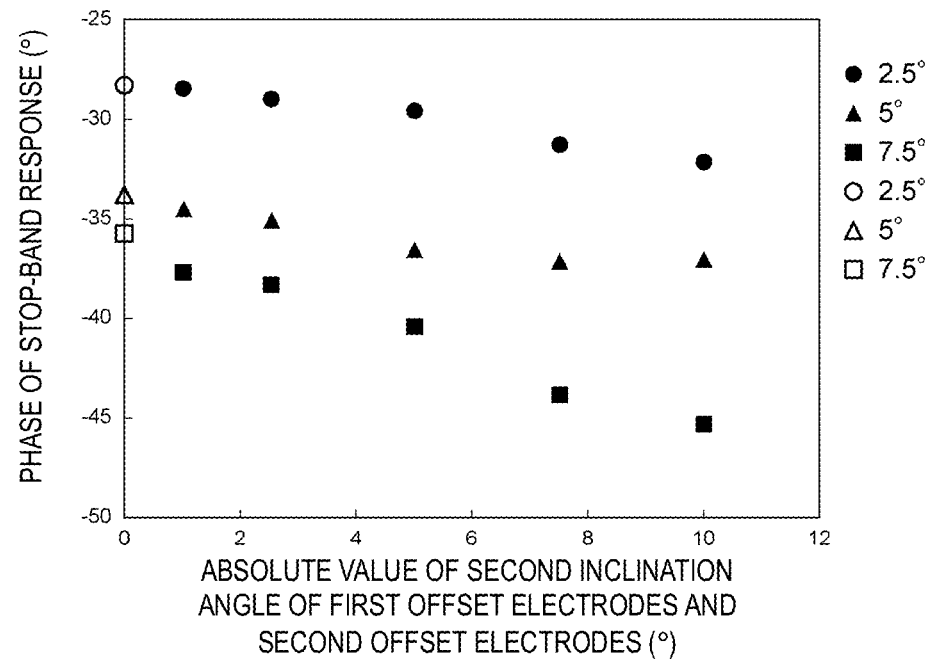
FIG. 4 is a diagram illustrating relationships between a first inclination angle of a first envelope and a second envelope, the absolute value of a second inclination angle of first offset electrodes and second offset electrodes, and the phase of the stop-band response, in acoustic wave devices according to the first preferred embodiment of the present invention and a comparative example.

The conditions of the acoustic wave devices according to the first preferred embodiment were set as follows:
The piezoelectric film: a material of 50° Y-cut LiTaO$_3$
The number of pairs of a first electrode finger and a second electrode finger of the IDT electrode: 67 pairs
The overlap width of the IDT electrode: about 20λ
The wave length of the IDT electrode: about 1.5 μm
The number of electrode fingers of a reflector: 41
The wave length of a reflector: about 1.5 λm
The conditions of the acoustic wave devices according to the comparative example were set as follows:
The number of pairs of a first electrode finger and a second electrode finger of the IDT electrode: 67 pairs
The overlap width of the IDT electrode: about 20λ
The wave length of the IDT electrode: about 1.5 μm
The number of electrode fingers of a reflector: 41
The wave length of a reflector: about 1.5 μm The acoustic wave devices fabricated as described above were used to measure the phase of the stop-band response. FIG. 4 illustrates the results.

In the first preferred embodiment, the first inclination angle of the first busbar is the same or substantially the same as that of the second busbar. The direction in which the first busbar and the second busbar extend is parallel or substantially parallel to the first envelope and the second envelope. Accordingly, the relationships illustrated in FIG. 4 are relationships between the first inclination angle of the first envelope and the second envelope and the phase of the stop-band response. The same is true for the comparative example.

FIG. 4 is a diagram illustrating relationships between a first inclination angle of the first envelope and the second envelope, the absolute value of a second inclination angle of the first offset electrodes and the second offset electrodes, and the phase of the stop-band response, in the acoustic wave devices according to the first preferred embodiment and the comparative example.

The circular plots in FIG. 4 indicate the results of the case in which the first inclination angle of the first envelope and the second envelope is about 2.5°; the triangular plots indicate the results of about 5°; the rectangular plots indicate the results of about 7.5°. The black plots indicate the results of the first preferred embodiment, and the white plots indicate the results of the comparative example.

As illustrated in FIG. 4, in the case where the first inclination angle of the first envelope and the second envelope is about 2.5°, the stop-band response in the first preferred embodiment is reduced or prevented compared with the comparative example. It was discovered that, as the absolute value of the second inclination angle of the first offset electrodes and the second offset electrodes increases, the stop-band response may be further reduced or prevented. Also in the cases in which the first inclination angles of the first envelope and the second envelope are about 5° and about 7.5°, similar results are obtained. Thus, in the first preferred embodiment, the stop-band response may be reduced or prevented effectively.

Preferably, the absolute value of the second inclination angle of the first offset electrodes and the second offset electrodes is about 10° or less, for example. When the absolute value of the second inclination angle becomes larger than this angle, return loss at and around the antiresonant frequency may be degraded.

As illustrated in FIG. 4, it was discovered that, as the first inclination angle of the first envelope and the second envelope increases, the stop-band response may be reduced or prevented more effectively.

As illustrated in FIG. 1, in the first preferred embodiment, the first envelope A1 and the second envelope B1 incline relative to the acoustic-wave propagation direction. Accordingly, when viewed in the acoustic-wave propagation direction, the first offset electrodes 7c and the second offset electrodes 8c overlap the overlap area. This causes acoustic waves, which are excited in the overlap area, to be reflected by the first offset electrodes 7c and the second offset electrodes 8c. In the first preferred embodiment, the first offset electrodes 7c and the second offset electrodes 8c incline relative to the direction orthogonal or substantially orthogonal to the acoustic-wave propagation direction. This enables the reflection state of acoustic waves, which are excited in the overlap area, to be the reflection state in which the stop-band response is small. Thus, the stop-band response may be reduced or prevented effectively.

In the present preferred embodiment, the absolute value of the second inclination angle of the first offset electrodes 7c is preferably the same or substantially the same as that of the second offset electrodes 8c. However, the absolute value of the second inclination angle of the first offset electrodes 7c may be different from that of the second offset electrodes 8c.

The first envelope A1 and the second envelope B1 do not necessarily extend in one direction. For example, the first envelope A1 and the second envelope B1 may bend.

Figure 5:
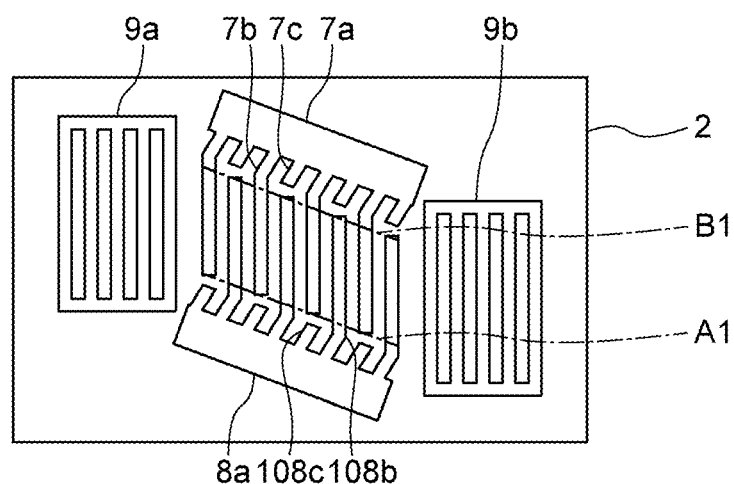
FIG. 5 is a schematic plan view of an acoustic wave device according to a modified example of the first preferred embodiment of the present invention.

FIG. 5 is a schematic plan view of an acoustic wave device according to a modified example of the first preferred embodiment.

The modified example is different from the first preferred embodiment in that second offset electrodes 108c extend parallel or substantially parallel to the direction in which the first offset electrodes 7c extend and that second electrode fingers 108b bend similarly to the first electrode fingers 7b. Thus, the first electrode fingers 7b and the first offset electrodes 7c may be disposed so as to a point symmetrical positional relationship with the second electrode fingers 108b and the second offset electrodes 108c.

Figure 6:
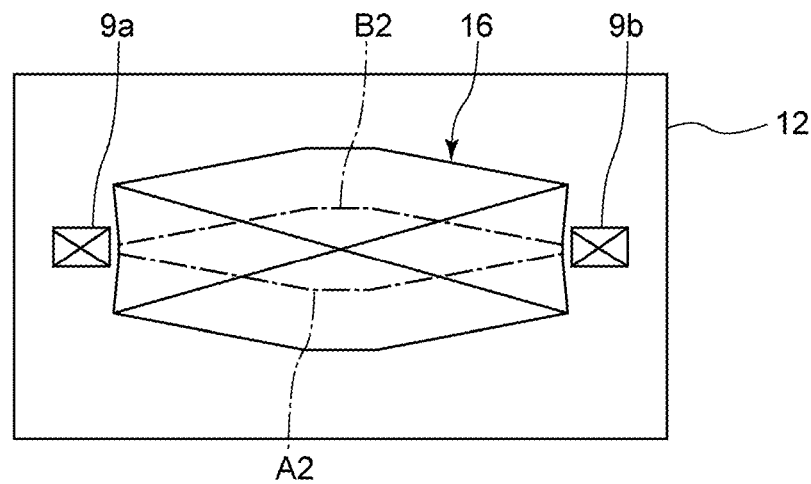
FIG. 6 is a simplified plan view of an acoustic wave device according to a second preferred embodiment of the present invention.
Figure 7:
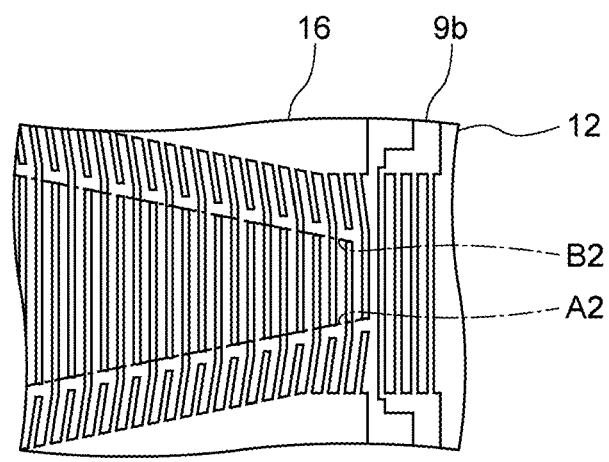
FIG. 7 is a schematic enlarged plan view of an acoustic wave device according to the second preferred embodiment of the present invention.

FIG. 6 is a simplified plan view of an acoustic wave device according to a second preferred embodiment. FIG. 7 is a schematic enlarged plan view of the acoustic wave device according to the second preferred embodiment. FIG. 6 is a schematic view in which the IDT electrode and the reflectors are illustrated by using polygons with two lines forming an X shape.

As illustrated in FIG. 6, a piezoelectric substrate according to the present preferred embodiment is a piezoelectric substrate 12. The piezoelectric substrate 12 is preferably made of, for example, 127.5° or about 127.5° Y-cut LiNbO₃. The cut-angle and the material of the piezoelectric substrate 12 are not limited to those described above.

An IDT electrode 16 is preferably made of, for example, a multilayer metal film including multiple layers laminated in the following sequence when viewed from the piezoelectric substrate 12 side: a NiCr layer, a Ti layer, an Al layer, and a Pt layer.

As illustrated in FIG. 6, the planar shape of the IDT electrode 16 according to the present preferred embodiment is or substantially is a rhombus. A first envelope A2 and a second envelope B2 in the IDT electrode 16 substantially define a rhombus.

More specifically, the first envelope A2 has a bent shape. A portion, which is positioned near the center in the acoustic-wave propagation direction, of the first envelope A2 extends parallel or substantially parallel to the acoustic-wave propagation direction. Both end portions of the portion, which extends parallel or substantially parallel to the acoustic-wave propagation direction, of the first envelope A2 are connected to portions extending obliquely relative to the acoustic-wave propagation direction. As illustrated in FIGS. 6 and 7, the first envelope A2 may have any shape as long as the first envelope A2 includes a portion extending obliquely relative to the acoustic-wave propagation direction. The first envelope A2 may include a portion extending parallel or substantially parallel to the acoustic-wave propagation direction. The same is true for the second envelope B2.

Also in the second preferred embodiment, the stop-band response may be reduced or prevented. This will be shown below.

Multiple acoustic wave devices having the structure according to the second preferred embodiment were fabricated with different second inclination angles of the first offset electrodes and the second offset electrodes. In the second preferred embodiment, the absolute value of the second inclination angle of the first offset electrodes is the same or substantially the same as that of the second offset electrodes. The absolute values of the first inclination angles of the portions in which the first envelope inclines were the same or substantially the same as those of the second envelope, and were set to about 10°.

The conditions of the acoustic wave devices according to the second preferred embodiment were set as follows:

The piezoelectric film: a material of 127.5° Y-cut LiNbO₃

The number of pairs of a first electrode finger and a second electrode finger of the IDT electrode: 162 pairs The overlap width of the IDT electrode: equal to or more than 3λ and equal to or less than about 32λ

The wave length of the IDT electrode: about 1.6 μm

The number of electrode fingers of a reflector: 41

The wave length of a reflector: about 1.6 μm

Figure 8:
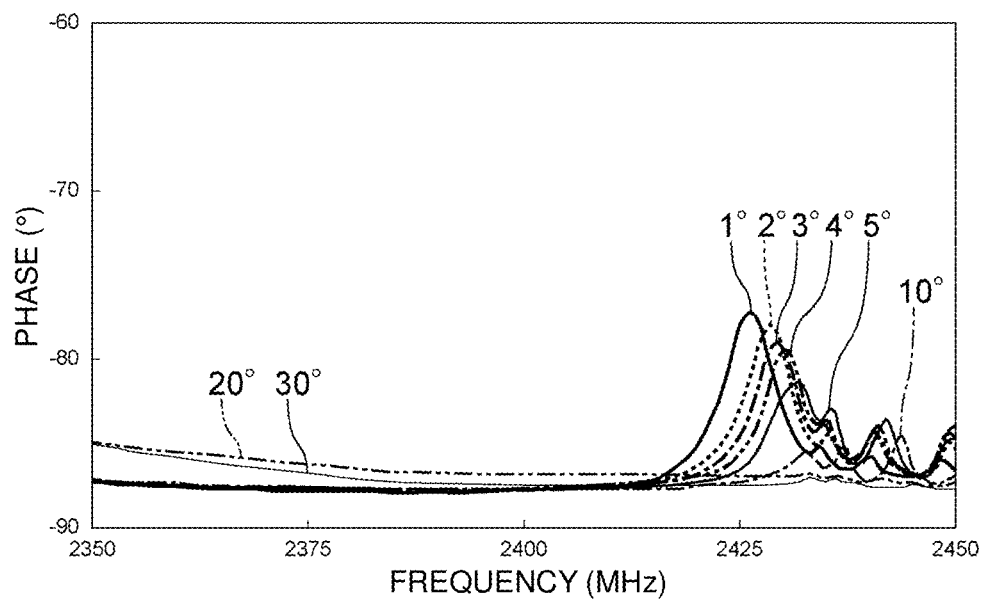
FIG. 8 is a diagram illustrating relationships between the absolute value of a second inclination angle of the first offset electrodes and the second offset electrodes, frequency, and phase, in acoustic wave devices according to the second preferred embodiment of the present invention.

The acoustic wave devices fabricated as described above were used to measure the phase. FIG. 8 illustrates the results.

FIG. 8 is a diagram illustrating the relationships between the absolute value of a second inclination angle of the first offset electrodes and the second offset electrodes, the frequency, and the phase, in the acoustic wave devices according to the second preferred embodiment. The angles illustrated in FIG. 8 indicate the absolute values of the second inclination angles of the first offset electrodes and the second offset electrodes.

As illustrated in FIG. 8, it was discovered that, as the absolute value of the second inclination angle of the first offset electrodes and the second offset electrodes increases, the stop-band response is reduced or prevented. Thus, also in the second preferred embodiment, the stop-band response may be reduced or prevented effectively.

Preferably, the absolute value of the second inclination angle of the first offset electrodes and the second offset electrodes is about 5° or more, for example. More preferably, the absolute value of the second inclination angle is about 8° or more, for example. This enables the stop-band response to be further reduced or prevented. As described above, preferably, the absolute value of the second inclination angle of the first offset electrodes and the second offset electrodes is about 10° or less, for example.

Figure 9:
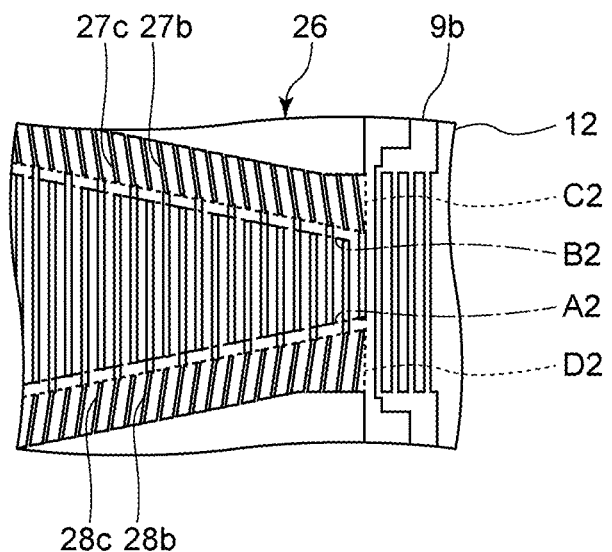
FIG. 9 is a schematic enlarged plan view of an acoustic wave device according to a third preferred embodiment of the present invention.

FIG. 9 is a schematic enlarged plan view of an acoustic wave device according to a third preferred embodiment of the present invention.

The sizes, in the traverse direction, of each first electrode finger 27b, each second electrode finger 28b, each first offset electrode 27c, and each second offset electrode 28c are regarded as widths. In the present preferred embodiment, the widths of each first electrode finger 27b, each second electrode finger 28b, each first offset electrode 27c, and each second offset electrode 28c in a first area C2 and a second area D2 in an IDT electrode 26 are different from those in the second preferred embodiment. Other than the point described above, the acoustic wave device according to the present preferred embodiment has a structure the same or substantially the same as the acoustic wave device according to the second preferred embodiment.

More specifically, the widths of a first electrode finger 27b and a first offset electrode 27c in the first area C2 are narrower than those of a first electrode finger 27b in the overlap area. The widths of a second electrode finger 28b and a second offset electrode 28c in the second area D2 are narrower than that of a second electrode finger 28b in the overlap area.

In this case, the duty ratio in the first area C2 and the second area D2 is smaller than that in the overlap area. In the present preferred embodiment, for example, the duty ratio in the overlap area is preferably about 0.5, and the duty ratio in the first area C2 and the second area D2 is preferably about 0.4. Accordingly, the acoustic velocity of acoustic waves in the first area C2 and the second area D2 is higher than that in the overlap area. This relationship in acoustic velocity enables degradation of the return loss in its own band to be reduced or prevented in the present preferred embodiment. Its own band indicates a frequency band between the resonant frequency and the anti-resonant frequency. In the present preferred embodiment, the resonant frequency is preferably about 2220 MHz, and the anti-resonant frequency is preferably about 2310 MHz, for example.

In addition, also in the present preferred embodiment, similarly to the second preferred embodiment, the stop-band response may be reduced or prevented.

Figure 10:
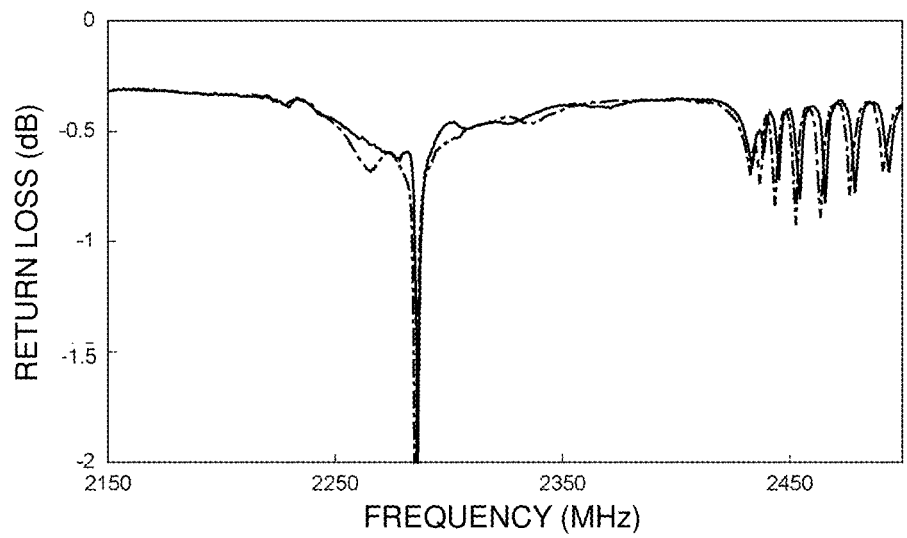
FIG. 10 is a diagram illustrating return loss of acoustic wave devices according to the second preferred embodiment and the third preferred embodiment of the present invention.

FIG. 10 is a diagram illustrating return loss of the acoustic wave devices according to the second preferred embodiment and the third preferred embodiment. The solid line indicates the result of the third preferred embodiment, and the long dashed short dashed line indicates the result of the second preferred embodiment.

The conditions of the acoustic wave device according to the second preferred embodiment and the third preferred embodiment are similar to that according to the second preferred embodiment described above. The absolute value of the second inclination angle of the first offset electrodes and the second offset electrodes was set to about 10°.

As illustrated in FIG. 10, it was discovered that, in the second preferred embodiment and the third preferred embodiment, the stop-band response at and around 2450 MHz may be reduced or prevented. In the third preferred embodiment, as illustrated in the result indicated by using the solid line in FIG. 10, degradation of the return loss in its own band may be further reduced or prevented.

As described above, an exemplary acoustic wave device as an acoustic wave resonator is described. The present invention may be applied preferably to a band pass filter and a multiplexer. These examples will be described below.

Figure 11:
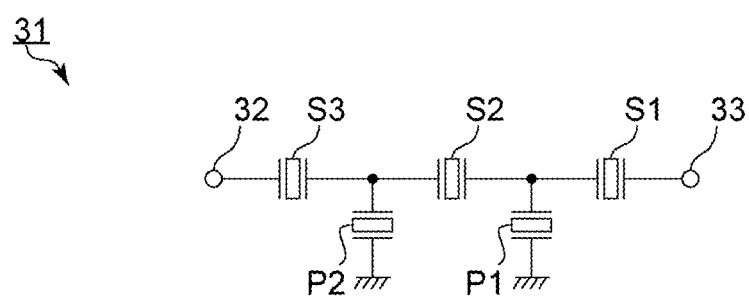
FIG. 11 is a circuit diagram of a band pass filter according to a fourth preferred embodiment of the present invention.

FIG. 11 is a circuit diagram illustrating a band pass filter according to a fourth preferred embodiment.

A band pass filter 31 is a ladder filter including a serial arm resonator S1, a serial arm resonator S2, a serial arm resonator S3, a parallel arm resonator P1, and a parallel arm resonator P2. In the present preferred embodiment, all of the serial arm resonator S1, the serial arm resonator S2, the serial arm resonator S3, the parallel arm resonator P1, and the parallel arm resonator P2 have a structure the same or substantially the same as that of the acoustic wave device according to the first preferred embodiment. Any configuration may be used as long as at least one of the acoustic wave resonators included in the band pass filter 31 is an acoustic wave device according to a preferred embodiment of the present invention.

The band pass filter 31 includes an antenna terminal 32 electrically connected to an antenna, and a signal terminal 33 connected to a signal potential. The serial arm resonator S1, the serial arm resonator S2, and the serial arm resonator S3 are electrically connected in series to each other between the signal terminal 33 and the antenna terminal 32. The parallel arm resonator P1 is electrically connected between a connecting point between the serial arm resonator S1 and the serial arm resonator S2 and the ground potential. The parallel arm resonator P2 is electrically connected between a connecting point between the serial arm resonator S2 and the serial arm resonator S3 and the ground potential.

The circuit configuration of the band pass filter 31 is not limited to that described above. Any circuit configuration may be used as long as an acoustic wave resonator defining an acoustic wave device according to a preferred embodiment of the present invention is included. The band pass filter 31 according to the present preferred embodiment is a ladder filter. Alternatively, the band pass filter 31 may be a band pass filter in which the pass band is generated by using a longitudinally coupled resonator acoustic wave filter. The band pass filter 31 may be a transmit filter or a receive filter.

The band pass filter 31 according to the present preferred embodiment includes an acoustic wave resonator which is the same or substantially the same as the acoustic wave device according to the first preferred embodiment, enabling the stop-band response to be reduced or prevented. In the case where the band pass filter 31 and a different band pass filter are connected to a common point, an influence of the stop-band response on the different band pass filter may be reduced or prevented. For example, degradation in the different band pass filter of insertion loss caused by the stop-band response of the band pass filter 31 hardly occurs.

Preferably, the parallel arm resonator P1 or the parallel arm resonator P2 of the band pass filter 31 is an acoustic wave device according to a preferred embodiment of the present invention. This enables an influence on the filter characteristics, which is caused by the stop-band response, to be further reduced or prevented.

Preferably, the serial arm resonator S3, which is the closest acoustic wave resonator to the antenna, is an acoustic wave device according to a preferred embodiment of the present invention. Thus, when the band pass filter 31 and a different band pass filter are connected to a common point, an influence of the stop-band response on the different band pass filter may be further reduced or prevented.

Figure 12:
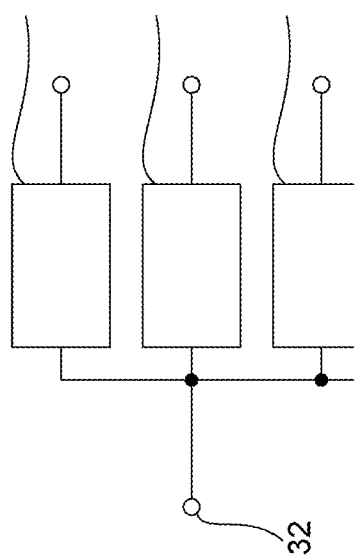
FIG. 12 is a schematic view of a multiplexer according to a fifth preferred embodiment of the present preferred embodiment.

FIG. 12 is a schematic view of a multiplexer according to a fifth preferred embodiment.

A multiplexer 40 includes the antenna terminal 32 and also includes a first band pass filter 41A, a second band pass filter 41B, a third band pass filter 41C, and other band pass filters which are connected to the antenna terminal 32 in common. The number of band pass filters included in the multiplexer 40 is not particularly limiting. The multiplexer 40 may be used, for example, in carrier aggregation.

The first band pass filter 41A preferably has the same or substantially the same structure as the band pass filter 31 according to the fourth preferred embodiment illustrated in FIG. 11. The multiplexer 40 may have any configuration as long as at least one band pass filter having the same or substantially the same configuration as that of the band pass filter 31 according to the fourth preferred embodiment is included.

Also in the present preferred embodiment, similarly to the fourth preferred embodiment, the stop-band response may be reduced or prevented. In addition, an influence on a different band pass filter which is caused by the stop-band response of the first band pass filter 41A may be reduced or prevented, and degradation in the filter characteristics, such as insertion loss, hardly occurs.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a piezoelectric substrate; and
    an interdigital transducer (IDT) electrode disposed on the piezoelectric substrate; wherein
    the IDT electrode includes:
        a first busbar and a second busbar that oppose each other;
        a plurality of first electrode fingers that include first ends connected to the first busbar;
        a plurality of second electrode fingers that include first ends connected to the second busbar, the plurality of second electrode fingers and the plurality of first electrode fingers being interdigitated;
        a plurality of first offset electrodes that include first ends connected to the first busbar and that face the plurality of second electrode fingers with gaps interposed in between; and
        a plurality of second offset electrodes that include first ends connected to the second busbar and that face the plurality of first electrode fingers with gaps interposed in between;
    the IDT electrode includes an overlap area in which the first electrode fingers and the second electrode fingers overlap each other when viewed in an acoustic-wave propagation direction, the first electrode fingers and the second electrode fingers being adjacent to each other;
    the acoustic-wave propagation direction is parallel or substantially parallel to a direction in which widths of the first and second electrode fingers in the overlap area extends;
    when a virtual line connecting leading ends of the plurality of first electrode fingers to each other is referred to as a first envelope, the first envelope is inclined relative to the acoustic-wave propagation direction;
    when a virtual line connecting leading ends of the plurality of second electrode fingers to each other is referred to as a second envelope, the second envelope is inclined relative to the acoustic-wave propagation direction; and
    a direction in which the first offset electrodes extend and a direction in which the second offset electrodes extend is inclined relative to a direction orthogonal or substantially orthogonal to the acoustic-wave propagation direction.

2. The acoustic wave device according to claim 1, wherein
    the first busbar includes a portion extending parallel or substantially parallel to the second envelope; and
    the second busbar includes a portion extending parallel or substantially parallel to the first envelope.

3. The acoustic wave device according to claim 2, wherein
    the first busbar extends parallel or substantially parallel to the second envelope; and
    the second busbar extends parallel or substantially parallel to the first envelope.

4. The acoustic wave device according to claim 1, wherein an absolute value of an inclination angle of the first offset electrodes and the second offset electrodes is equal to or more than about 5°, the inclination angle being determined relative to the direction orthogonal or substantially orthogonal to the acoustic-wave propagation direction.

5. The acoustic wave device according to claim 4, wherein the absolute value of the inclination angle of the first offset electrodes and the second offset electrodes is equal to or less than about 10°.

6. A band pass filter comprising:
    a plurality of acoustic wave resonators; wherein
    at least one of the acoustic wave resonators is the acoustic wave device according to claim 1.

7. A multiplexer comprising:
    an antenna terminal electrically connected to an antenna; and
    a plurality of band pass filters that are electrically connected to the antenna terminal in common and that have pass bands different from each other; wherein
    at least one of the band pass filters is the band pass filter according to claim 6.

8. The acoustic wave device according to claim 1, wherein
    in a first area in which the first electrode fingers include the first offset electrodes when viewed in a direction parallel or substantially parallel to a direction in which the second envelope extends, the first electrode fingers include portions extending parallel or substantially parallel to the direction in which the first offset electrodes extend; and
    in a second area in which the second electrode fingers include the second offset electrodes when viewed in a direction parallel or substantially parallel to a direction in which the first envelope extends, the second electrode fingers include portions extending parallel or substantially parallel to the direction in which the second offset electrodes extend.

9. The acoustic wave device according to claim 1, wherein
    the first busbar and the second busbar are inclined relative to the acoustic-wave propagation direction; and
    the first bulbar and the second bulbar extend parallel or substantially parallel to each other.

10. The acoustic wave device according to claim 1, wherein the first envelope and the second envelope define or substantially define a rhombus in plan view.

11. The acoustic wave device according to claim 1, wherein
    sizes, in a transverse direction, of the first electrode fingers, the second electrode fingers, the first offset electrodes, and the second offset electrodes are referred to as widths;
    the widths of the first electrode fingers and the first offset electrodes in a first area are narrower than the widths of the first electrode fingers in the overlap area, the first area being an area in which the first electrode fingers include the first offset electrodes when viewed in a direction parallel or substantially parallel to a direction in which the second envelope extends; and the widths of the second electrode fingers and the second offset electrodes in a second area are narrower than the widths of the second electrode fingers in the overlap area, the second area being an area in which the second electrode fingers include the second offset electrodes when viewed in a direction parallel or substantially parallel to a direction in which the first envelope extends.

12. The acoustic wave device according to claim 1, further comprising:

a pair of reflectors made from a same material as the IDT electrode; wherein the IDT electrode is provided between the pair of reflectors.

13. The acoustic wave device according to claim 1, wherein each of the plurality of first electrode fingers have a bent shape in a direction extending from the first busbar; and each of the plurality of second electrode fingers have a bent shape in a direction extending from the second busbar.

14. The acoustic wave device according to claim 1, wherein the first offset electrodes and the second offset electrodes extend in parallel or substantially in parallel with one another.

15. The acoustic wave device according to claim 1, wherein the IDT electrode is made of a multilayer metal film including laminated layers.

* * * * *